United States Patent [19]

Antula

[11] 3,755,092

[45] Aug. 28, 1973

[54] METHOD OF INTRODUCING IMPURITIES INTO A LAYER OF BANDGAP MATERIAL IN A THIN-FILM SOLID STATE DEVICE

[75] Inventor: Jovan Antula, Munich, Germany

[73] Assignee: Max-Planck-Gesellschaft zur Foerderung der, Goettingen, Germany

[22] Filed: Aug. 3, 1970

[21] Appl. No.: 60,531

[30] Foreign Application Priority Data

Aug. 1, 1969 Germany .................. P 19 39 267.7

[52] U.S. Cl. ................ 204/35 N, 29/584, 204/164, 317/234 T, 317/235 T, 317/235 AQ

[51] Int. Cl. .......................................... C23f 17/00

[58] Field of Search ................ 317/234 T, 235 AQ, 317/235 T; 204/298, 58, 192, 35 R, 35 N, 156, 164; 29/584

[56] References Cited

UNITED STATES PATENTS

| | | | |
|---|---|---|---|
| 3,481,839 | 12/1969 | Inoue | 204/35 R |
| 3,465,176 | 9/1969 | Tanaka et al. | 317/235 AQ |
| 3,408,283 | 10/1968 | Chopra | 204/298 |
| 3,372,315 | 3/1968 | Hartman | 317/235 |

FOREIGN PATENTS OR APPLICATIONS

| | | | |
|---|---|---|---|
| 69,930 | 2/1946 | Norway | 204/58 |
| 741,753 | 11/1943 | Germany | 204/58 |

OTHER PUBLICATIONS

Feisl, W. "Research in Tunnel Emission," IEEE Spectrum, December 1964, page 57, et. seq.

Jones et al., I.B.M. Technical Disclosure, Vol. 9, No. 10, March 1967, page 1417

*Primary Examiner*—John H. Mack
*Assistant Examiner*—W. I. Solomon
*Attorney*—Spencer and Kaye

[57] ABSTRACT

A method of manufacturing a thin-film solid state devices comprising a body of bandgap-material, preferably aluminium oxide, sandwiched between two conductive electrodes and containing between about $10^{18}$ – $10^{20}$ impurity atoms per $cm^3$, said impurity atoms being selected from the group of Cu, Cd, Zn, Ag, Ni, and I. The preferred method of manufacture comprises the steps of providing an electrically conductive substate, forming a layer of bandgap material on said substrate, said layer having an effective thickness between about 15 and 300 Angstrom units, introducing into said layer ions of said impurity material by exposing a surface of said layer opposite to said substrate to a fluid (which may be a liquid or a gas under reduced pressure) containing ions of said impurity material, applying a voltage across said layer, said voltage having a polarity and magnitude such that said ions are accelerated and drawn into said layer without forming a deposit of said impurity material on said expsoed surface, and providing electrodes on said substrate and said exposed surface.

8 Claims, 4 Drawing Figures

Patented Aug. 28, 1973 3,755,092

INVENTOR.
Jovan Antula
BY
Spencer & Kaye
ATTORNEYS.

METHOD OF INTRODUCING IMPURITIES INTO A LAYER OF BANDGAP MATERIAL IN A THIN-FILM SOLID STATE DEVICE

BACKGROUND OF THE INVENTION

The present invention relates to a thin-film solid state device and to a method of manufacturing such devices.

Thin-film solid state devices, e.g., the so-called thin-film transistor, have found wide applications in the electronics field because of lending themselves to mass production techniques by vacuum deposition and similar methods. However, those thin-film devices operate almost exclusively on the field-effect principle, and consequently threshold or rectifying elements, e.g., zener diodes have not been produced by thin-film techniques up to now.

It is an object of the invention to provide a method of manufacturing a thin-film solid state device which is simple and reliable.

A further object of the invention is to provide a method of doping thin layers of bandgap material.

A still further object of the invention is to provide a method of manufacturing a thin-film solid state device for which most if not all of the production steps can be carried out in the same or a similar environment.

A still further object of the invention is to provide a new and improved solid state device which exhibits threshold characteristics and may be used as a zener diode.

These and other objects are achieved according to an embodiment of the invention by a method of manufacturing a thin-film solid state device comprising a body of bandgap material doped with an impurity material, and at least two electrodes in contact with said body characterized by the steps of providing an electrically conductive substrate, depositing a layer of bandgap material on said substrate, said layer having an effective thickness between about 15 and 300 Angstrom units, exposing the surface of said layer which is opposite to said substrate to a fluid containing ions of said impurity material, applying a voltage across said layer, said voltage having a polarity and magnitude such that said ions are accelerated to and drawn into said layer without forming a deposit of said impurity material on said surface, and providing at least one electrically conductive electrode both on said substrate and on said surface.

The impurity material can consist of a member from the group of cadmium, copper zinc, silver, nickel, and iodine.

Other objects, features and advantages of this invention will be apparent to those skilled in the art from the following detailed description of preferred embodiments thereof together with the accompanying drawings in which.

Figure 1:
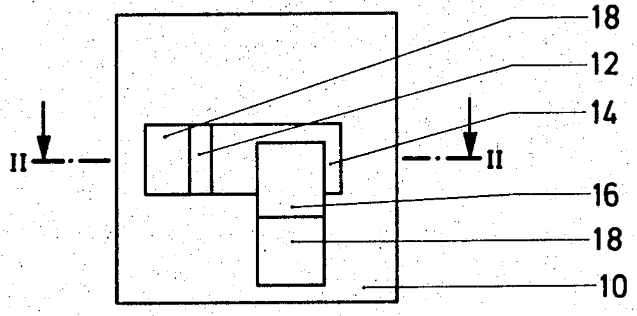
FIG. 1 is a diagramatic plan view of a solid state diode employing the invention.
Figure 2:
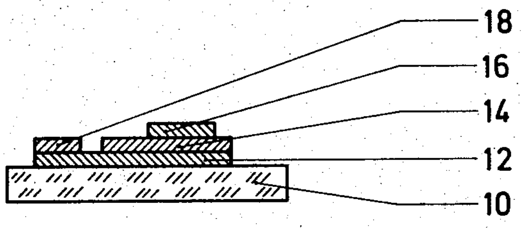
FIG. 2 is a sectional view along the line II—II of FIG. 1.

The embodiment of the thin-film solid state device shown in FIGS. 1 and 2 comprises a support body 10, which consists of an insulating material as glass or ceramic. Deposited upon a surface of support body 10 is a thin electrically conductive film 12 which consists in the present embodiment of aluminum. The thickness of film 12 is not critical and is mainly determined by mechanical reasons. On the surface of film 12 which is opposite to support body 10 is a thin layer of bandgap material. The term "bandgap material" is defined for the present invention as a material having an energy bandgap and a relatively high resistivity. Suitable materials are insulators, such as aluminum oxide, silicon monoxide, silicon dioxide and similar materials and less preferable but still useful, intrinsic semiconductors.

The surface of layer 14 which is opposite to electrically conductive film 12 is provided with a second electrically conductive film 16. Films 12 and 16 form the electrodes of the device and may be provided with contact pads 18, consisting, e.g., of evaporated gold layers.

Figure 3:
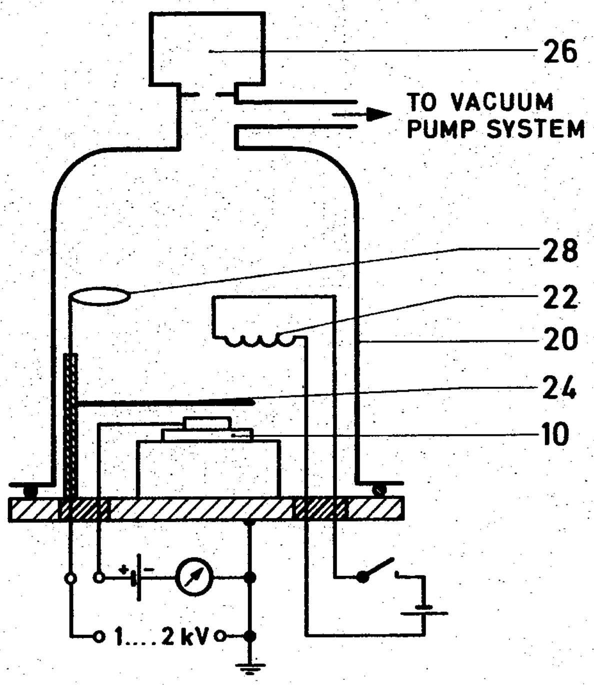
FIG. 3 is a diagramatic sectional view of an apparatus for manufacturing a solid state device employing the invention.
Figure 4:
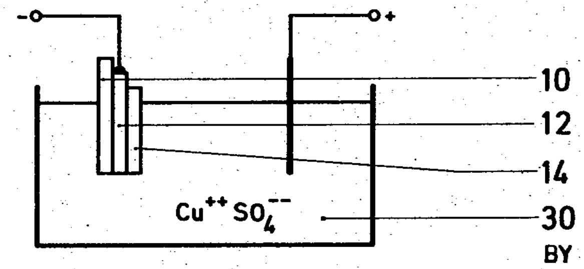
FIG. 4 is a sectional view of another apparatus useful for manufacturing a solid state device according to the invention.

Preferred methods of manufacturing thin-film solid state devices of the type described with reference to FIGS. 1 and 2 are now described with reference to FIGS. 3 and 4.

According to a first method of manufacturing the device depicted in FIGS. 1 and 2, a glass wafer 10 is positioned in a vacuum chamber 20 which is connected to a vacuum pump system (not shown) of known construction. The vacuum chamber 20 comprises a known device 22 for evaporating a material to be deposited on the support body 10, and a movable mask member 24 shown only diagrammatically and used to define the area of the surface of the support body 10 onto which the material is deposited. Vacuum chamber 20 is further connected to an ion source 26 of known construction which is adapted to produce ions of the impurity material. The ion source may compromise an evaporation source and an electron gun for producing an electron beam which ionizes the evaporated impurity metal atoms.

For manufacturing the solid state device according to FIGS. 1 and 2, chamber 20 is evacuated to a pressure below about $10^{-5}$ Torr and an aluminum film corresponding to film 12 in FIG. 1 and 2 and having a thickness of, e.g., some microns is evaporated through mask 24 onto the upper surface of substrate body 10.

After the aluminum film 12 has been formed, dry oxygen is introduced into the chamber 20 and the pressure is raised to ,e.g., 0.1 to 0.001 Torr and a glow discharge is produced in well-known manner by applying a voltage in the order of a few thousand volts between a glow discharge electrode 28 and the metal walls of vacuum chamber 20. Simultaneously a relatively small auxiliary voltage of say a few volts is applied between the walls of the vacuum chamber 20 and the metal film 12 to draw oxygen ions onto the exposed surface of film 12 and to oxidize an exposed portion of the surface of metal film 12 and forming thereby oxide layer 14. The thickness of the oxide layer 14 is mainly determined by the voltage between the metal film 12 and the walls of the vacuum chamber 20. The value of the voltage may be determined by experiment and the oxidizing step is terminated when the current flowing between film 12 and the wall of the vacuum chamber going to a small constant value. Very thin oxide films up to 20 Angstrom units can be obtained even without the auxiliary voltage by exposing the surface to the oxygen ions produced in the glow discharge.

The arrangement obtained by the above described method steps may be created further in several ways.

The first alternative which may be preferred if the oxide layer is relatively thin, e.g. between 16 and 20 Angstrom units, is to reduce the pressure in the vacuum chamber 20 again to a value below, e.g., $10^{-5}$ or $10^{-6}$ Torr, to energize ions of 26 and to accelerate the produced ions by a voltage of appropriate polarity applied between ion source 26 and metal film 12. The magnitude of the voltage being such that the field strength across oxide layer 14 is in the order of $10^6$ volts per centimeter. Thus, the impurity material ions produced by ion source 26 are drawn into the oxide layer 14 and the described treatment is continued until the desired doping level, e.g., $10^{20}$ ions per $cm^3$ is attained.

After oxide layer 14 has been doped as described, evaporation source 22 is energized again and a second aluminum film corresponding to film 16 is evaporated through an appropriate opening of the movable mask 24, in a manner known per se.

The thickness of metal film 16 is relatively low, e.g., between 100 and 200 Angstrom units so that metal film 16 acts as "spreading resistance" which equalizes the current density of the current flowing across the doped aluminum oxide layer 14.

All the steps take place without breaking vacuum.

The alternative second part of the present method comprises the steps of removing the support body 10 with the aluminum film 12 and the oxide layer 14 from vacuum chamber 20 and immersing this arrangement in an electrolytic bath 30 (FIG. 4) which comprises a relatively dilute solution of a salt of the impurity material, e.g., an aqueous solution containing 1 percent by weight $CuS0_4$.

The portion of the metal film 12 which is not covered by the oxide layer should be suitably masked or not immersed into the electrolytic bath.

A voltage of about 1.5 to 3 volts is then applied between metal layer 12 and the electrolyte bath 30, the voltage and current density being such that the copper ions are drawn into the oxide layer without forming a copper deposit on the exposed surface of oxide layer 14. Suitable current densities are e.g. 0.1 to 0.5 microamperes per squaremillimetre. The duration of the described treatment depends on the thickness of the aluminium oxide layer and is about one second per Angstrom thickness for a doping level of about $10^{19}$ charge units per $cm^3$.

Preferably, the electrolytical treatment is carried out about at room temperature.

The doping profile, e.g., the density of doping material across the doped layer 14 may be controlled by changing the voltage or current applied as a function of time.

The doped oxide layer is then removed from the electrolytic bath 30, cleaned and dried and provided with an electrode, e.g., by applying a conductive paint or by evaporating a metal film as described with reference to film 16.

According to a further modification, the layer of bandgap material is produced by anodizing a surface zone of a suitable metal, e.g., aluminum, in an electrolytic bath. Anodizing an aluminum surface is a well-known technique and needs not be described. The steps of producing the oxide layer by anodizing, and doping the oxide layer so produced as described with reference to FIG. 4 may be carried out in the same vessel and even with the same electrolyte whereby the polarity of the applied voltage is reversed if the anodically produced oxide layer is to be doped with positive (metal) ions.

The thickness of the produced oxide layers is easily controlled by the applied voltage: A voltage of one volt between the metal to be anodized and the electrolytic bath producing an oxide film thickness of about 13.5 Angstrom units.

It should pointed out that the apparent or "ion" thickness of the anodically produced oxide layer is not identical with the effective thickness as used in the specification and claims. It is assumed that the effective thickness of the oxide layer which determines the tunnel probability across the oxide layer is determined by the thinnest portions of the oxide layer the thickness of which varies to some extent from point to point across the surface of the layer. Anodically oxidizing aluminum by using voltages between 1.5 to 3 volts produces oxide layers having an effective thickness of about 20 to 25 Angstrom units, which is a good compromise in that both the tunnel probability and the breakthrough voltage are relatively high.

The thin-film solid state device disclosed herein may be used as a zener diode which has the advantages of a relatively low zener voltage, e.g., 2 volts, an extremely low operating current which is of the order of a fraction of a microampere. A further advantage is that the temperature coefficient of the stabilized voltage is smaller than the temperature coefficient of a p-n junction operating in the same voltage range.

The present diode is also useful as an temperature-independent resistance if the voltage across the device is adjusted to the value where the temperature coefficient is about zero.

The devices described are further useful as photosensitive devices. In such case at least one of the electrodes must be transparent at least to some extent for the radiation to be detected. The above described device, for which the aluminum layer 16 has a thickness between 100 and 200 Angstrom units, would be suitable for detecting visible light.

The present method may be useful also if the effective thickness of the layer of band gap material is greater than 30 Angstrom units, e.g., up to several hundred Angstrom units. Layers of such increased thickness may exhibit a characteristic negative resistance region, similar to that for tunnel diodes, especially if this device is operated in vacuo.

It will be understood that the above description of the present invention is susceptible to various modifications, changes and adaptions, and the same are intended to be comprehended within the meaning and range of equivalence of the appended claims.

I claim:

1. A method of manufacturing a thin-film solid state device having a body of bandgap material doped with an impurity material, and at least two electrodes in contact with said body comprising the steps of : providing an electrically conductive substrate, forming a layer of bandgap material having an effective thickness between about 15 and 300 Angstrom units on said substrate , exposing the surface of said layer which is opposite to said substrate to an electrolytic bath containing ions of said impurity material, placing an electrode connected to one terminal of a d.c. source within the bath, connecting the opposite polarity terminal of the d.c. source to said substrate; applying a d.c. voltage across said layer, said voltage having a polarity and magnitude such that said ions are accelerated to and drawn into said layer without forming a deposit of said impurity material on said surface, and providing at least one electrically conductive electrode on said surface.

2. The method according to claim 1 wherein: said substrate is formed by evaporating, under reduced pressure, a metal film onto a surface of a support body; said layer of bandgap material is formed by oxidizing a surface region of said metal layer by subjecting the exposed surface of said metal layer to an electrical discharge in an oxygen containing gas of reduced pressure; and a second metal layer is evaporated, under reduced pressure, onto the exposed surface of said oxide layer for forming the electrode.

3. The method according to claim 1 wherein said layer has an effective thickness of between 15 and 30 Angstrom units.

4. The method according to claim 1 wherein said d.c. voltage is between approximately 1.5 and 3 volts.

5. The method according to claim 1 wherein said layer of bandgap material is formed by anodizing a surface region of an anodically oxidable metal in an electrolytic bath.

6. The method according to claim 5 wherein said metal is aluminum.

7. The method according to claim 6 wherein said impurity material is copper.

8. The method according to claim 6 wherein said impurity material is selected from the group consisting of cadmium, copper, zinc, silver, nickel and iodine.

* * * * *

UNITED STATES PATENT OFFICE
CERTIFICATE OF CORRECTION

Patent No. 3,755,092 Dated August 28th, 1973

Inventor(s) Jovan Antula

It is certified that error appears in the above-identified patent and that said Letters Patent are hereby corrected as shown below:

In the heading of the patent, line 6, after "der" insert --Wissenschaften e.V.--. In the Abstract, line 19, change "exspoed" to --exposed--. Column 1, line 49, after "copper" insert a comma --,--.

Signed and sealed this 16th day of July 1974.

(SEAL)
Attest:

McCOY M. GIBSON, JR.
Attesting Officer

C. MARSHALL DANN
Commissioner of Patents